US008969868B2

(12) United States Patent
Shieh et al.

(10) Patent No.: US 8,969,868 B2
(45) Date of Patent: Mar. 3, 2015

(54) THIN FILM TRANSISTOR WITH UV LIGHT ABSORBER LAYER

(71) Applicant: National Chiao Tung University, Hsinchu (TW)

(72) Inventors: Han-Ping D. Shieh, Hsinchu (TW); Po-Tsun Liu, Hsinchu (TW); Yun-Chu Tsai, Taichung (TW); Min-Yen Tsai, Taichung (TW); Li-Feng Teng, Taoyuan County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/975,611

(22) Filed: Aug. 26, 2013

(65) Prior Publication Data

US 2014/0361287 A1    Dec. 11, 2014

(30) Foreign Application Priority Data

Jun. 5, 2013   (TW) ............................. 102119854 U

(51) Int. Cl.
*H01L 29/10*   (2006.01)
*H01L 29/786*   (2006.01)

(52) U.S. Cl.
CPC ................................. *H01L 29/7869* (2013.01)
USPC .................................... 257/43; 257/E29.273

(58) Field of Classification Search
CPC ............ H01L 29/7869; H01L 27/1225; H01L 27/124
USPC .............................................. 257/43, E29.273
See application file for complete search history.

(56) References Cited

U.S. PATENT DOCUMENTS

| 2010/0295042 | A1* | 11/2010 | Yano et al. ....................... 257/43 |
| 2012/0175611 | A1* | 7/2012 | Kirita et al. ....................... 257/43 |
| 2013/0056074 | A1* | 3/2013 | Isobe et al. ....................... 136/263 |

OTHER PUBLICATIONS

Min-Yen Tsai et al., "Transparent UV shielding effects for negative-bias-illumination stress instability in a—InGaZnO TFTs", Dec. 7, 2012, Taipei, Taiwan Optics & Photonics Taiwan, International Conference 2012.
Min-Yen Tsai et al.,"Photostability Improvement of a—InGaZnO TFTs by Introducing a Transparent UV Shielding Layer", May 19, 2013, The Society of information display (SID)2013 Int'l Symposium.

* cited by examiner

*Primary Examiner* — Trung Q Dang
(74) *Attorney, Agent, or Firm* — Bacon & Thomas, PLLC

(57) ABSTRACT

A thin film transistor comprises a transparent substrate, a gate is disposed on the transparent substrate, a gate insulator is disposed on the gate and the transparent substrate, an active layer is disposed on the gate insulator, an electrode layer is electrically connected the active layer and the portion of the active layer is exposed, and an ultraviolet light absorbing layer is disposed on the electrode layer. By using the advantage of the ultraviolet light absorbing layer with the range of visible light transmittance and with the component protection, preventing the optical characteristics of the thin film transistor from the outside moisture is achieved, and by adjusting the parameters in the thin film deposition process to change its conductivity.

7 Claims, 7 Drawing Sheets

THIN FILM TRANSISTOR WITH UV LIGHT ABSORBER LAYER

BACKGROUND OF THE INVENTION

1. Field of the Invention

The present invention related to a thin film transistor, particularly to a thin film transistor with UV light absorber layer.

2. Description of the Prior Art

As for common metal oxide semiconductors based thin film transistor, the active layer made of In—Ga—Zn—O, electrodes, gate insulator and protection layer are used to form the thin film transistor.

FIG. 1 illustrates the cross-sectional view of the conventional thin film transistor. The conventional thin film transistor 100 is mostly applied in the displays and relevant IC products, such as the active matrix thin film transistor liquid crystal display (AMTFT LCD) and active matrix organic light emitting diodes (AMOLED). Because it is necessary to reach the threshold voltage of active layer to activate the transistor for outputting the current of source electrode, thus the threshold voltage will affect the efficiency of current output, and further affect the performance of applied display, OLED or IC. Common metal oxide semiconductor material possesses the range of visible light transmittance. However, the valance level in the energy gap of active layer often has the energy gap defect of carrier capture. The energy gap defect will generate the electron-hole coupling by the activation of energy (such as photon), and then further affect the threshold voltage of active layer.

As for the active matrix thin film transistor liquid crystal display (AMTFT LCD) and active matrix organic light emitting diodes (AMOLED), the repeated arrangement of pixel and the input of signal are adopted to reach the image display function of displays in the operation process of thin film transistor displays. However, the thin film transistors (TFTs) are used to control the liquid crystal capacitance outputted to every pixel by the voltage. Also, TFTs are used to control the driving current of OLED which means TFTs dominate the lightness of OLED. Under the illumination of back light or external light, common metal oxide thin film transistor will change the transform characteristic curve due to the electron-hole coupling by the activation of light, and then change the threshold voltage, as shown in FIG. 2.

FIG. 2 illustrates the variation of transform characteristic curve for the threshold voltage under light illumination. As shown in FIG. 2, because there is more metal oxide semiconductor material, there is stronger photosensitive for the light in the range of ultraviolet light, thus there is severe variation of threshold voltage when the illumination light wavelength is smaller than 460 nm. When the variation of threshold voltage is larger, the instability of thin film transistor will be increased.

SUMMARY OF THE INVENTION

According to the drawbacks of prior art, the present invention discloses a thin film transistor with UV light absorber layer. The main purpose is to reduce the operation current, threshold voltage, and subcritical amplitude variation of thin film transistor under light illumination through absorbing the ultraviolet light by the oxide material.

Another purpose of the present invention is to use a thin film transistor with UV light absorber layer to reduce the variation of parameters-threshold voltage ($V_{th}$) to be 10% smaller, and to reduce the subcritical amplitude variation to be 10% smaller after illuminated by the light for a long time.

According to the abovementioned purposes, the present invention discloses a thin film transistor includes a transparent substrate, a gate is disposed on the transparent substrate, a gate insulator is disposed on the gate and the transparent substrate, an active layer is disposed on the gate insulator, an electrode layer is electrically connected the active layer and the portion of the active layer is exposed, and an ultraviolet light absorbing layer is disposed on the electrode layer. By the advantage of the ultraviolet light absorbing layer with the range of visible light transmittance and with the component protection to prevent the optical characteristics of the thin film transistor from the outside moisture, and by adjusting the parameters in the thin film deposition process to change its conductivity, such that the photosensitive of the transform characteristic curve of the thin film transistor can be reduced, and a threshold voltage can be stabilized to operate within a certain range.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a thin film transistor. It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

Figure 1:
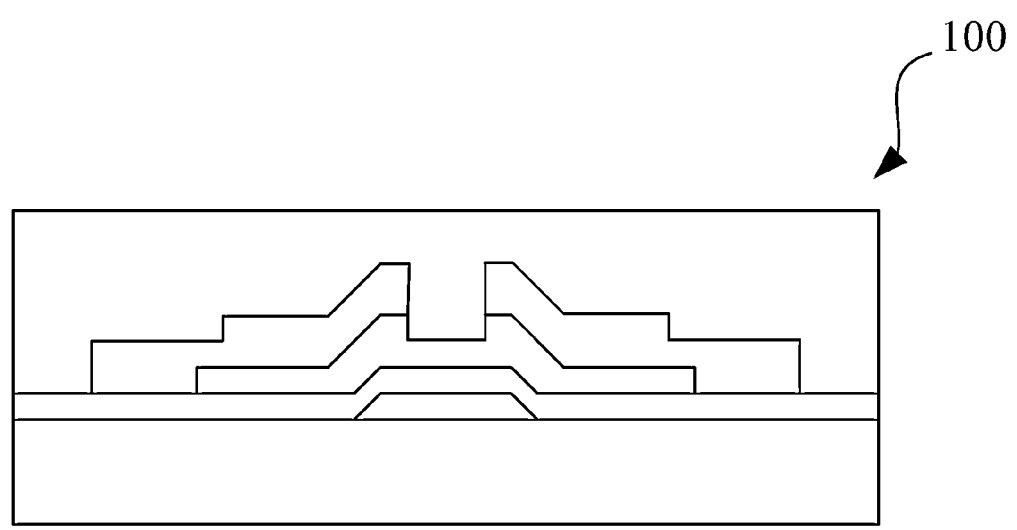
FIG. 1 illustrates the cross-sectional view of the conventional thin film transistor.
Figure 2:
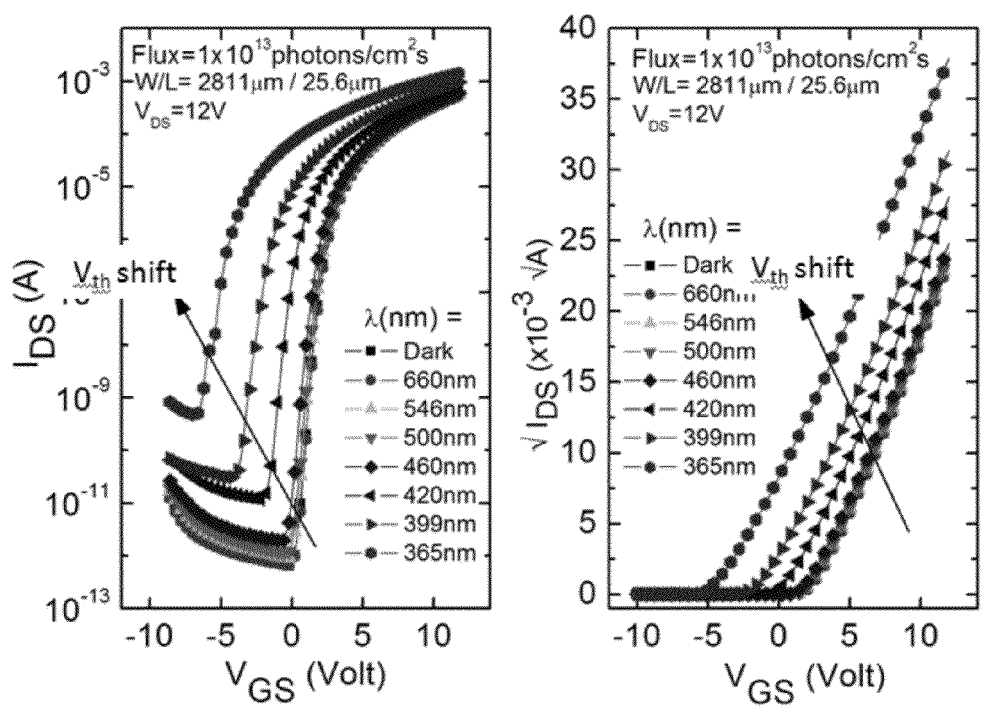
FIG. 2 illustrates the variation of transform characteristic curve for the threshold voltage under light illumination.
Figure 3:
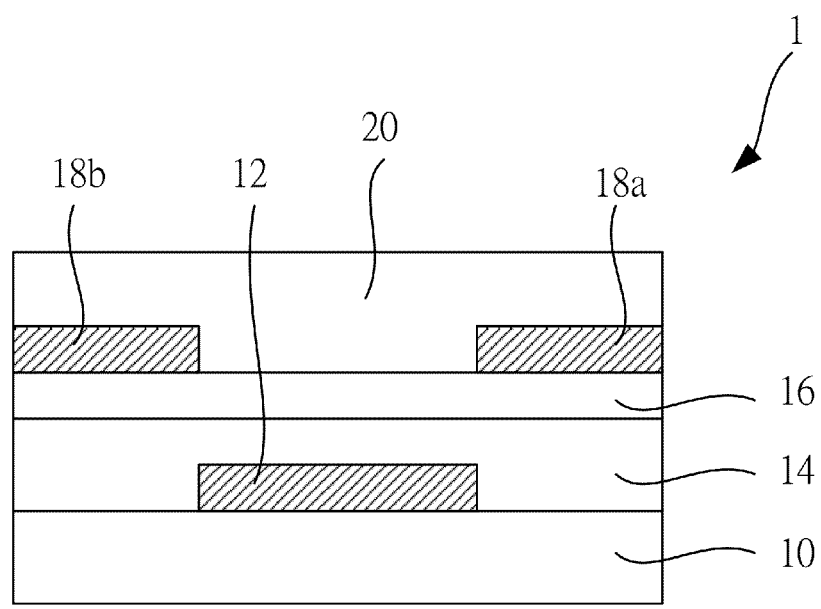
FIG. 3 illustrates the cross-sectional view of the thin film transistor with UV light absorber layer disclosed by the present invention.

Please refer to FIG. 3, firstly, FIG. 3 illustrates the cross-sectional view of the thin film transistor with UV light absorber layer disclosed by the present invention. In FIG. 3, the thin film transistor 1 comprises a transparent substrate 10, a gate 12, a gate insulator 14, an active layer 16, an electrode layer 18a, 18b and a protection layer 20 disposed on the abovementioned structure. In an embodiment of the present invention, the material of gate 12 and electrode layer 18a, 18b may be indium tin oxide (ITO), indium zinc oxide (IZO) and Al-doped ZnO (AZO) or conductive metal, such as copper (Cu), silver (Ag), aluminum (Al) and molybdenum (Mo). In an embodiment shown in FIG. 3 of the present invention, the material of active layer 16 may be transparent semiconductor material, particularly the semiconductor material with resistance between $10^{-4}$ to $10^{6}$ $\Omega$-cm, such as indium gallium zinc oxide (IGZO). In another preferred embodiment of the present invention, the material of active layer 16 may be oxide or nitride materials which the elements come from IB to IVA groups, and or their derived compound, such as ZTO, IGO, IZTO, AZTO, ZnN, IGO, ZnON and HIZO.

In addition, the protection layer 20 shown in the embodiment of FIG. 3 is an ultraviolet light absorbing layer, and its resistance is greater than $10^5$ $\Omega$-cm and its ultraviolet light transmittance is smaller than 60%. In this embodiment, the protection layer 20 is disposed on the electrode layer 18a, 18b by the thin film deposition process, in order to cover all layers on the transparent substrate 10. Its material may be zinc oxide (ZnO) compound with VIB group elements dopants or IVB group elements dopants, particularly molybdenum zinc oxide (Mo—Zn—O) or zirconium zinc oxide (ZrZnO) etc.

Figure 4:
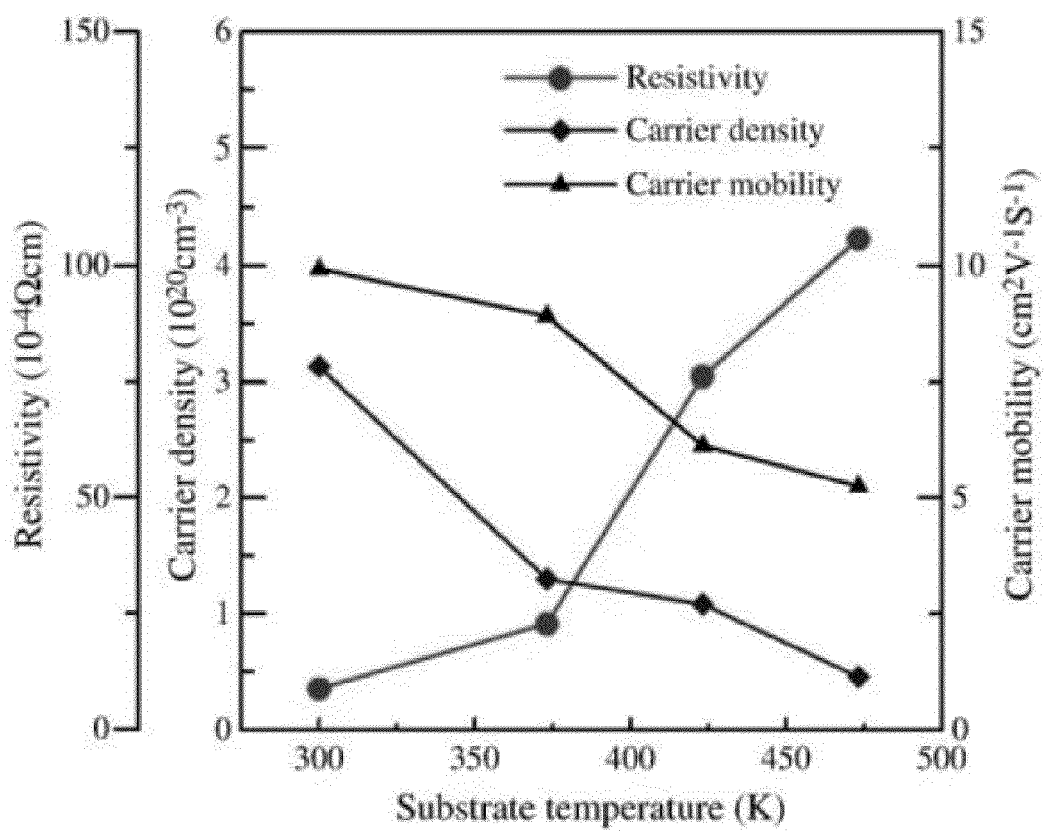
FIG. 4 illustrates the relation between the substrate temperature and the resistance of ultraviolet light absorbing layer.

In the embodiment of FIG. 3, the conductivity of ultraviolet light absorbing layer 20 can be adjusted by changing the operation pressure, plasma power intensity and composition of target material or substrate (not shown in Figure) temperature during the sputtering process. FIG. 4 illustrates the relation between the substrate temperature and the resistance of ultraviolet light absorbing layer.

In FIG. 4, because the ultraviolet light absorbing layer 20 is located above the active layer 16 and the electrode layer 18a, 18b of the thin film transistor 1, the parameters in the deposition process of ultraviolet light absorbing layer 20 can be adjusted to change the conductivity of the ultraviolet light absorbing layer 20 to close the range of transparent metal oxide. The resistance of the ultraviolet light absorbing layer 20 can be reduced. Meantime, if the doping amount of minor element in the ultraviolet light absorbing layer 20 is changed, the resistance characteristics and the ultraviolet light transmittance of the ultraviolet light absorbing layer 20 can be adjusted.

According to the abovementioned description, after the thin film transistor 1 with ultraviolet light absorbing layer 20 disclosed by the present invention is illuminated by light, the threshold voltage of the thin film transistor 1 with ultraviolet light absorbing layer 20 can be stabilized, and the film thickness of ultraviolet light absorbing layer 20 is proportional to the stabilized ability of threshold voltage. In addition, after the thin film transistor 1 with ultraviolet light absorbing layer 20 disclosed by the present invention is illuminated by light, its threshold voltage shift is smaller than that of the thin film transistor without ultraviolet light absorbing layer 20.

The present invention also discloses another embodiment for a thin film transistor 1 with ultraviolet light absorbing layer 20. In this embodiment, the structure of thin film transistor 1 is the same as that of FIG. 3, which will not be further described here. The difference with respect to the abovementioned embodiment is that the material for the gate 12, gate insulator 14 and electrode layer 18a, 18b of thin film transistor 1 can be the same as that of ultraviolet light absorbing layer 20. The material of the gate 12, gate insulator 14 and electrode layer 18a, 18b can be substituted by the material of ultraviolet light absorbing layer 20, such as zinc oxide (ZnO) compound, particularly molybdenum zinc oxide (Mo—Zn—O) or zirconium zinc oxide (ZrZnO) etc. When the material of ultraviolet light absorbing layer 20 is used to substitute the material of gate insulator 14, after the thin film transistor 1 with ultraviolet light absorbing layer 20 disclosed by the present invention is illuminated by light, its threshold voltage shift is smaller than that of the thin film transistor without ultraviolet light absorbing layer 20. In addition, when the material of gate insulator 14 is the same as that of ultraviolet light absorbing layer 20, after the thin film transistor 1 is illuminated by ultraviolet light, the threshold voltage of thin film transistor 1 will be stabilized, and the film thickness of gate insulator 14 will be proportional to the stability of threshold voltage.

In addition, when the resistance of ultraviolet light absorbing layer 20 is smaller than $10^{-2}$ $\Omega$-cm and used to substitute the electrode layer 18a, 18b and/or gate 12 of thin film transistor 1, the range of visible light transmittance of ultraviolet light absorbing layer 20 will be still greater than 80%, and the range of ultraviolet light transmittance will be smaller than 60%. After the thin film transistor 1 is illuminated by light, its threshold voltage shift will be smaller than that of the thin film transistor without the substitution of electrode layer 18a, 18b and/or gate 12. Thus, in this embodiment, when the electrodes (gate 12, electrode layer 18a, 18b) are involved in the thin film transistor 1 with ultraviolet light absorbing layer 20, the ultraviolet light can be absorbed by the thin film transistor 1, such that the photosensitive of the transform characteristic curve of the thin film transistor 1 can be reduced. The material of ultraviolet light absorbing layer 20 can be used to substitute the material of gate 12 and/or electrode layer 18a, 18b. In addition, the electrode layer 18a, 18b is the source and the drain.

According to the abovementioned description, as for the thin film transistor 1 with ultraviolet light absorbing layer 20 disclosed by the present invention, its ultraviolet light absorbing layer 20 not only can be used as the protection layer, but also can be used to absorb the ultraviolet light with high energy due to its distribution of visible light transmittance. Thus compared to the conventional thin film transistor, its transform characteristic curve is shown in FIG. 5 and FIG. 6.

Figure 5:
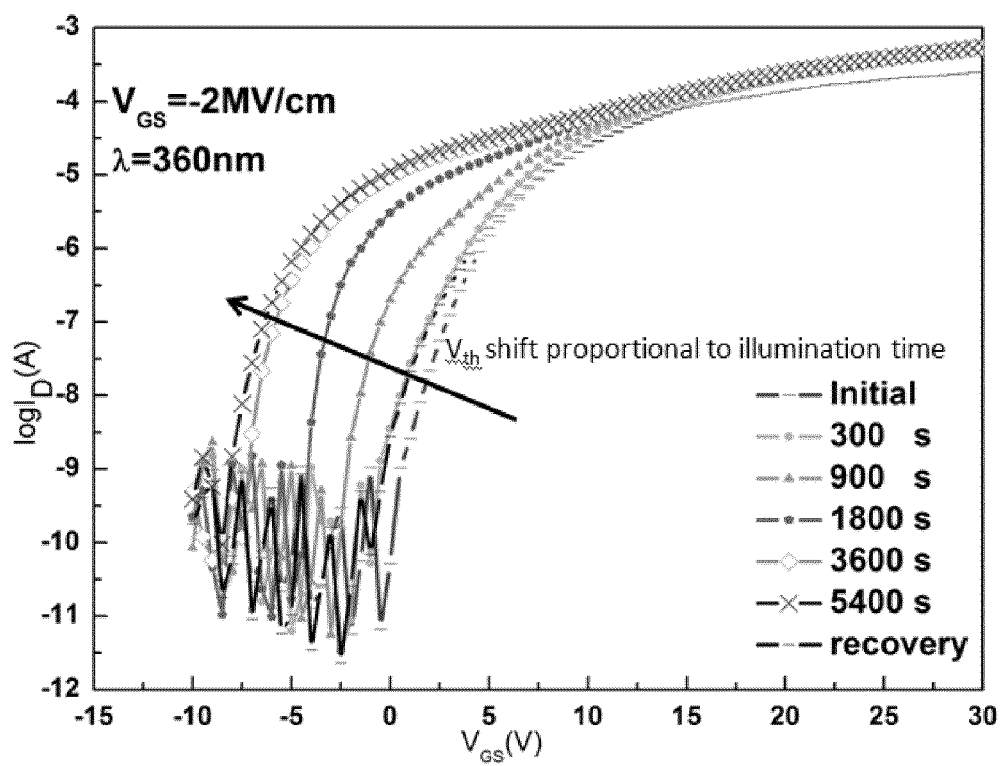
FIG. 5 illustrates the variation of threshold voltage and the transform characteristic curve of thin film transistor without UV light absorber layer disclosed by the present invention.
Figure 6:
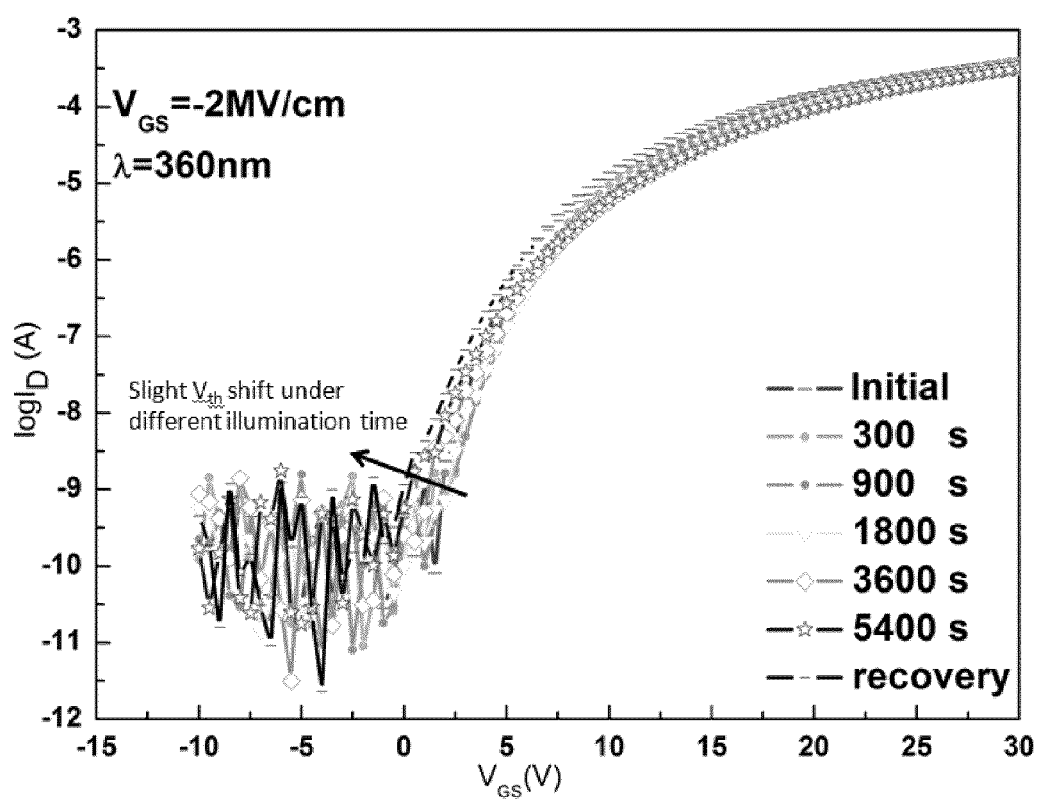
FIG. 6 illustrates the variation of threshold voltage and the transform characteristic curve of thin film transistor with UV light absorber layer disclosed by the present invention.

FIG. 5 illustrates the variation of threshold voltage and the transform characteristic curve of thin film transistor without UV light absorber layer disclosed by the present invention. FIG. 6 illustrates the variation of threshold voltage and the transform characteristic curve of thin film transistor with UV light absorber layer disclosed by the present invention. In FIG. 5 and FIG. 6, it is known that the variation for of threshold voltage the thin film transistor with ultraviolet light absorbing layer 20 disclosed by the present invention is only 10% relative to the thin film transistor without ultraviolet light absorbing layer.

Figure 7:
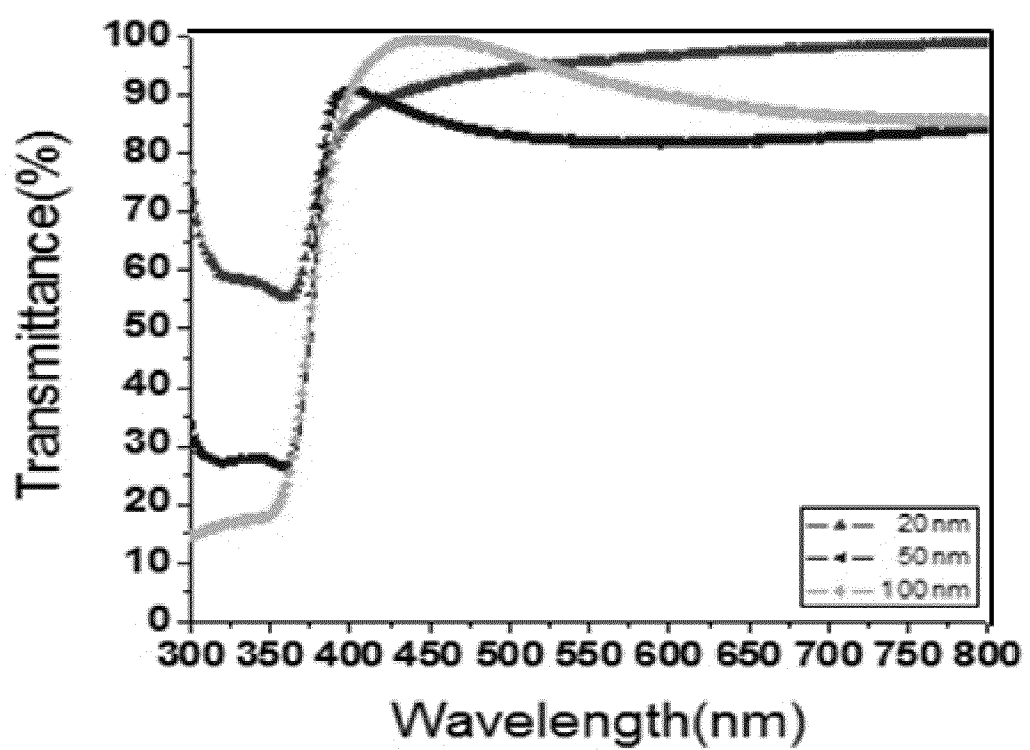
FIG. 7 illustrates the transmittance of ultraviolet light absorbing layer with different film thickness.

Thus, according to the ultraviolet light absorbing layer 20 disclosed by the present invention, the range of visible light transmittance can reach above 85%. The transmittance of ultraviolet light absorbing layer with different film thickness is shown in FIG. 7. The optical characteristics of the thin film transistor can be protected from the outside moisture through zinc oxide (ZnO) compound, or its derived compound, such as molybdenum zinc oxide (Mo—Zn—O) or zirconium zinc oxide (ZrZnO) etc. Thus, it can be applied in the thin film transistor 1 to increase the optical stability of the thin film transistor. The resistance of ultraviolet light absorbing layer 20 can be changed through adjusting the parameters in the thin film deposition process, such that the ultraviolet light absorbing layer 20 can possess the function of protection layer, insulation layer and electrode layer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin film transistor, comprising:
   a transparent substrate;
   a gate, the gate being disposed on the transparent substrate;
   a gate insulator, the gate insulator being disposed on the gate and the transparent substrate;
   an active layer, the active layer being disposed on the gate insulator;
   an electrode layer, the electrode layer being disposed on the active layer and a portion of the active layer being exposed; and
   an ultraviolet light absorbing layer is disposed on the active layer, wherein the material of the gate, the gate insulator and the electrode layer is selected from the group consisting of zinc oxide (ZnO) compound with VIB group elements dopants or IVB group elements dopants, molybdenum zinc oxide (Mo—Zn—O), and zirconium zinc oxide (ZrZnO).

2. The thin film transistor according to claim 1, wherein the material of gate and electrode layer is selected from the group consisting of indium tin oxide (ITO), indium zinc oxide (IZO) and Al-doped ZnO (AZO).

3. The thin film transistor according to claim 1, wherein the material of active layer is selected from the group consisting of zinc oxide (ZnO) and indium oxide ($In_2O_3$).

4. The thin film transistor according to claim 1, wherein the material of active layer comprises IB group to VA group related oxide or nitride.

5. The thin film transistor according to claim 1, wherein the material of active layer comprises transparent semiconductor material with resistance between $10^{-4}$ to $10^6$ $\Omega$-cm.

6. The thin film transistor according to claim 1, wherein the material of ultraviolet light absorbing layer comprises zinc oxide (ZnO) compound.

7. The thin film transistor according to claim 1, wherein the material of semiconductor material is selected from the group consisting of molybdenum zinc oxide (Mo—Zn—O) and zirconium zinc oxide (ZrZnO).

* * * * *